United States Patent [19]

Gulla

[11] Patent Number: 5,391,421
[45] Date of Patent: Feb. 21, 1995

[54] ADDITIVE PLATING PROCESS

[75] Inventor: Michael Gulla, Millis, Mass.

[73] Assignee: Shipley Company Inc., Marlborough, Mass.

[21] Appl. No.: 153,072

[22] Filed: Nov. 15, 1993

Related U.S. Application Data

[62] Division of Ser. No. 989,377, Dec. 11, 1992, Pat. No. 5,262,041.

[51] Int. Cl.⁶ .................................................. B32B 9/00
[52] U.S. Cl. ........................................ 428/209; 428/901
[58] Field of Search ................................. 428/209, 901

[56] References Cited

U.S. PATENT DOCUMENTS

| | | | |
|---|---|---|---|
| 3,099,608 | 7/1963 | Radovsky et al. | 204/15 |
| 4,360,570 | 11/1982 | Andreades et al. | 428/209 |
| 4,684,560 | 8/1987 | Minten et al. | 428/408 |
| 4,826,720 | 5/1989 | Wade | 428/209 |
| 4,861,640 | 8/1989 | Gurol | 428/209 |
| 4,897,164 | 1/1990 | Piano et al. | 204/15 |
| 5,017,742 | 5/1991 | Bladon | 174/266 |

FOREIGN PATENT DOCUMENTS 2123036 1/1984 United Kingdom .
89/08375 9/1989 WIPO .

*Primary Examiner*—Patrick J. Ryan
*Assistant Examiner*—Kam F. Lee
*Attorney, Agent, or Firm*—Robert L. Goldberg

[57] ABSTRACT

A method for electroplating over a nonconducting substrate comprising the steps of applying a thin film of a non-metallic conductive coating having a surface resistivity not exceeding 100 megaohms over said substrate, applying an electrically nonconductive coating over said conductive coating, said nonconductive coating having imaged recesses therein and electroplating metal into said recesses. The method is particularly useful for the manufacture of printed circuit boards.

13 Claims, 1 Drawing Sheet

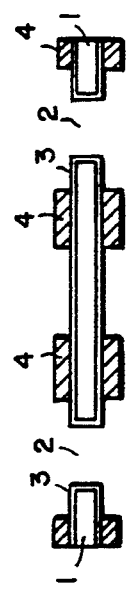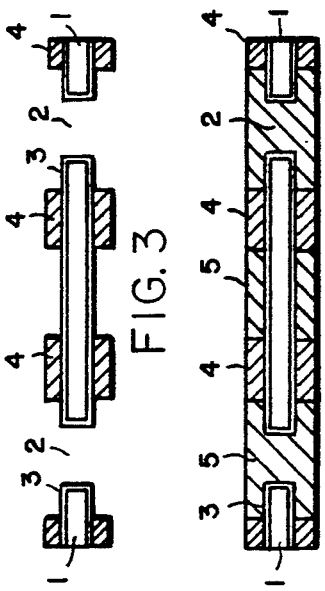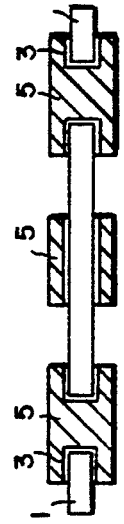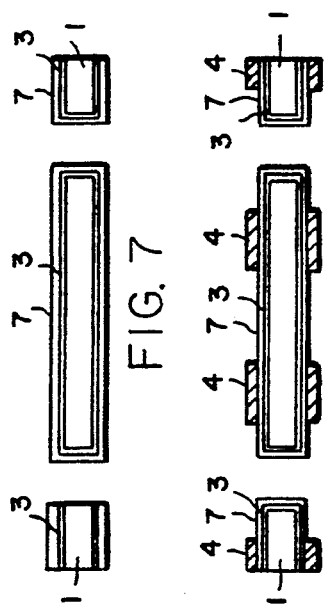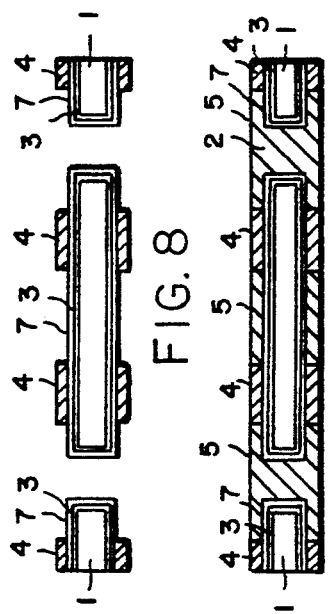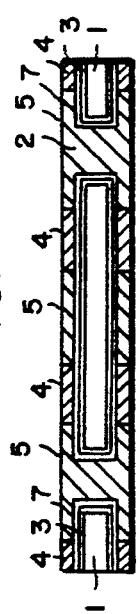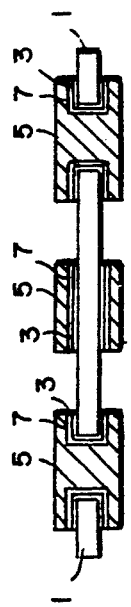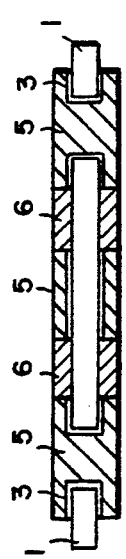

ADDITIVE PLATING PROCESS

This is a divisional of application Ser. No. 07/989,377, filed on Dec. 11, 1991, now U.S. Pat. No. 5,262,041.

BACKGROUND OF THE INVENTION

1. Introduction

This invention relates to electroplating nonconductors in a selective pattern. More particularly, the invention relates to an additive electroplating process for depositing metal in a desired pattern using an electrically conductive, non-metallic conversion coating. The invention is especially useful for an additive or semi-additive process for the manufacture of printed circuit boards where copper is deposited over a circuit board base material coated with a metal chalcogenide conversion coating.

2. Description of the Prior Art

Nonconductive surfaces are conventionally metalized by a sequence of steps comprising catalysis of the surface of the nonconductor to render the same catalytic to an electroless metal deposit followed by contact of the catalyzed surface with an electroless plating solution that deposits metal over the catalyzed surface in the absence of an external source of electricity. Metal plating continues for a time sufficient to form a metal deposit of the desired thickness. Following electroless metal deposition, the electroless metal deposit is optionally enhanced by electrodeposition of a metal over the electroless metal coating to a desired full thickness. Electrolytic deposition is possible because the electroless metal deposit serves as a conductive coating that permits electroplating.

Catalyst compositions used for electroless metal plating are known in the art and disclosed in numerous publications including U.S. Pat. No. 3,011,920, incorporated herein by reference. The catalysts of this patent consist of an aqueous suspension of a tin noble or precious (catalytic) metal colloid. Surfaces treated with such catalysts promote the generation of electrolessly formed metal deposits by the oxidation of a reducing agent in an electroless plating solution catalyzed by the catalytic colloid.

Electroless plating solutions are aqueous solutions containing dissolved metal and reducing agents in solution. The presence of dissolved metal and reducing agent together in solution can also result in solution instability and indiscriminate deposition of metal on the walls of containers for such plating solutions. This may necessitate interruption of the plating operation, removal of the plating solution from the tank and cleaning of tank walls and bottoms by means of an etching operation. Indiscriminate deposition may be avoided by careful control of the plating solution during use and by the use of stabilizers which inhibit indiscriminate deposition, but which also retard plating rate and often adversely effect deposit quality.

Attempts have been made in the past to avoid the need for an electroless plating solution by a direct plating process whereby a metal may be deposited directly over a treated nonconductive surface. One such process is disclosed in U.S. Pat. No. 3,099,608, incorporated herein by reference. The process disclosed in this patent involves treatment of the nonconductive surface with a tin palladium colloid which forms an essentially nonconductive film of colloidal palladium particles over the nonconductive surface. This may be the same tin palladium colloid used as a plating catalyst for electroless metal deposition. For reasons not fully understood, it is possible to electroplate directly over the catalyzed surface of the nonconductor from an electroplating solution though deposition occurs by propagation from a conductive surface. Therefore, deposition begins at the interface of a conductive surface and the catalyzed nonconductive surface. The deposit grows laterally along the catalyzed surface from this interface. For this reason, metal deposition onto the substrate using this process is slow. Moreover, deposit thickness is uneven with the thickest deposit occurring at the interface with the conductive surface and the thinnest deposit occurring at a point most remote from said interface.

An improvement in the process of U.S. Pat. No. 3,099,608 is disclosed in U.K. Patent No. 2,123,036B, incorporated herein by reference. In accordance with the process described in this patent, a surface is provided with metallic sites and the surface is then electroplated from an electroplating solution containing an additive that is said to inhibit deposition of metal on the metal surface formed by plating without inhibiting deposition on the metallic Sites over the nonconductive surface. In this way, there is said to be preferential deposition over the metallic sites with a concomitant increase in the overall plating rate and deposit uniformity. In accordance with the patent, the metallic sites are preferably formed in the same manner as in the aforesaid U.S. Pat. No. 3,099,608—i.e., by immersion of the nonconductive surface in a solution of a tin palladium colloid. The additive in the electroplating solution responsible for inhibiting deposition is described as one selected from the group of dyes, surfactants, chelating agents, brighteners and leveling agents. Many of such materials are conventional additives for electroplating solutions.

There are limitations to the above process. Both the processes of the U.S. and the U.K. patents for direct electroplating require conductive surfaces for initiation and propagation of the electroplated metal deposit. For this reason, the processes are limited in their application to metal plating of nonconductive substrates in areas in close proximity to a conductive surface.

U.S. Pat. No. 5,017,742, incorporated herein by reference, discloses a new method for directly electroplating the surface of a conductor which is said to be an improvement over the process of the referenced U.K. patent. The invention disclosed in this patent was based upon several discoveries. One discovery was that chalcogenide films of metals that function as electroless deposition catalysts may be directly electroplated without an intermediate electrolessly deposited layer. Another discovery was that many of such films are insoluble and unaffected by treatment chemicals used for plating of plastics or for circuit board fabrication and therefore, the process of the invention was suitable for the formation of printed circuits using processes such as pattern plating with dry film photoresists.

The chalcogenide film used for direct electroplating in accordance with U.S. Pat. No. 5,017,742 is formed by a process comprising catalysis of a nonconducting substrate with an electroless plating catalyst followed by treatment of the electroless plating catalyst with a solution of a chalcogenide, preferably a solution of a sulfide or sulfide precursor, to convert the catalyst to the corresponding chalcogenide. This chalcogenide is sufficiently conductive to permit direct electroplating over its surface without the need for an intermediate electroless metal deposit. It is further known that by appropriate control of concentration limits, the entire surface of a panel may be plated without the requirement for adjacent metal contacts in close proximity to the chalcogenide film.

An additional direct plate process is disclosed in published EPO application 89/00204 published Sep. 8, 1989 and incorporated herein by reference. In this process, the surface of a substrate is pretreated with a solution having an oxidizing capability; removed from said solution and rinsed; introduced into a solution containing a monomer such as pyrrole, furane, thiophene or its derivatives, which in a polymeric or copolymeric form, is electrically conductive; the substrate is then transferred into an acidic solution whereby an electrically conductive polymer layer, such as polymerized or copolymerized pyrrol, furane, thiophene or derivatives, is formed; residual solution is removed by rinsing; and the substrate is then electroplated.

A further development in the art of electroplating of nonconductors is disclosed in U.S. Pat. No. 4,897,164 incorporated herein by reference. In this patent, the process comprises forming a liquid dispersion of carbon black, coating a substrate with the dispersion, microetching the carbon black coating to form an array of circuit lines and electroplating the remaining array. The carbon black coating is sufficiently conductive to permit electroplating to take place.

SUMMARY OF THE INVENTION

In accordance with the process of the subject application, there is disclosed a method for directly electroplating a metal over a nonconducting surface in a selective pattern. The process of the invention broadly comprises the steps of formation of a non-metallic, electrically conductive conversion coating (such as the conductive coatings of U.S. Pat. No. 5,017,742 or EPO published application No. 89/00204) over a substrate, application of an organic mask in a desired relief pattern over said conductive conversion coating, and electroplating of metal into recesses within said mask inclusive of hole walls and substrate edges. Electroplating in a selective pattern is possible because the conductive conversion coating is continuous over the substrate and capable of conducting adequate current to all areas of the substrate surface to initiate electroplating, but electroplating takes place only on those surfaces of the conversion coating not covered by the mask. Following electroplating, the mask is desirably removed and the conductive conversion coating bared by such removal is also removed such as by chemical etching.

The invention is especially useful for the formation of printed circuit boards by an additive or semi-additive process. In this embodiment of the invention, a circuit board base material free of copper cladding, inclusive of innerlayer materials, would be provided with throughholes as necessary. Thereafter, following conventional treatment to improve adhesion of a subsequently deposited metal coating, the base material would have all of its surfaces, inclusive of through hole walls, coated with the conductive conversion coating. In a fully additive process, an organic mask would then be formed over the conductive conversion coating in a negative image of desired circuit lines. Metal would then be electroplated directly onto the conductive conversion coating exposed within the recesses of the mask to a desired thickness. The recesses in the mask will conform the metal deposit to the shape of the recesses whereby circuit lines will be of uniform cross-section.

In a semi-additive embodiment of the invention, following application of the conductive conversion coating, a thin layer of metal would be electroplated over the entire surface of the substrate, the mask would be applied in an image pattern, metal electroplated into the recesses within the mask, the mask removed and the thin metal layer and underlying conductive conversion coating removed by etching. The semi-additive process provides the advantage of more rapid metal deposition due to enhanced conductivity provided by the thin electroplated metal layer but suffers the disadvantage of having to remove metal such as by a chemical etching step.

In the above processes, removal of the conductive conversion coating following metal plating is desirable because the final product is a printed circuit board. If the conductive conversion coating were not removed, it would function as a source of conductivity between circuit lines resulting in shorting of the circuit. This removal step would not be necessary for other articles of manufacture where conductivity would not interfere with the operability of the article formed by the process of the invention.

DESCRIPTION OF THE DRAWINGS

FIGS. 1 through 6 of the drawings represent an additive process sequence for fabrication of a double-side through hole printed circuit board in accordance with one embodiment of the invention.

FIGS. 1, 2 and 7 through 10 of the drawings represent a semi-additive process sequence for fabrication of a double-side through hole printed circuit board in accordance with an alternative embodiment of the invention.

DESCRIPTION OF THE PREFERRED EMBODIMENTS

The subject invention is suitable for manufacture of a variety of commercial articles where a metal deposit is desired in a selective pattern over the surface of a nonconductor. Nameplates are an example of such articles. However, as described above, the invention is especially useful for the fabrication of printed circuit boards. For this reason, the description that follows is directed primarily to printed circuit board manufacture.

In printed circuit board manufacture, the substrate commonly used is an epoxy substrate reinforced with glass fibers. For most processes currently in use, the substrate would be copper clad on at least one of its surfaces and the process employed would be a subtractive process where undesired copper is removed by chemical etching. In accordance with the invention disclosed herein, an unclad substrate is the desired starting material and a typical process is depicted in FIGS. 1 through 7 of the drawings.

With reference to the drawings, in FIG. 1, there is shown a nonconductive substrate 1 provided with punched or drilled through holes 2. The through holes are used to form conductive pathways between circuits on the two surfaces of the board. It is desirable that the nonconducting substrate 1 and holes 2 be pretreated such as by the conventional pretreatment sequence of desmearing the hole walls with sulfuric acid, chromic acid or plasma etching or etchback of the holes with chromic acid or potassium permanganate followed by glass etching. Where an electroless plating catalyst is used in the process of formation of the non-metallic conversion coating, the desmearing step is desirably followed by a conditioning step that conditions the surfaces of the nonconductor to promote catalyst absorption. Such solutions are referred to in the art as conditioners and typically comprise and aqueous alkaline amine solution containing cationic agents. This treatment step, by itself, is old in the art and does not constitute a part of the invention. Proprietary conditioners are commercially available and a suitable material available from Shipley Company Inc. of Newton, Mass. is PM 231 Conditioner.

The next step in the process comprises formation of a conductive conversion coating 3 of FIG. 2 over nonconducting substrate 1 inclusive of the walls of through holes 2. The conversion coating is non-metallic and has a conductivity sufficient to enable plating to take place but is substantially less conductive than a metal coating such as copper. In accordance with the invention, the surface resistivity of the conversion coating preferably does not exceed 100 megaohms and more preferably, ranges between 10 megaohms and 10 kiloohms. The lower surface resistivity values are preferred.

In the preferred embodiment of the invention, the conversion coating is formed by treatment of the non-conducting surface with an electroless plating catalyst followed by conversion of the adsorbed catalytic species to a sulfide. Preferred electroless plating catalysts for formation of the adsorbed catalytic layer are those disclosed in U.S. Pat. Nos. 3,011,920 and 3,874,882 incorporated herein by reference. These catalysts comprise the reaction product formed by reduction of a noble or precious metal with stannous tin in an acid medium. The reduction product of palladium by tin in acidic media is the most preferred catalytic material for purposes of this invention. A suitable proprietary catalyst is identified as Cataposit ®44 Catalyst and is available from Shipley Company Inc. Non-noble metal catalysts are also suitable but lesser preferred, especially for the manufacture of printed circuit boards. Suitable non-noble metal catalysts include copper, nickel, cobalt, etc. and are disclosed in U.S. Pat. Nos. 3,993,799 and 3,993,491, both incorporated herein by reference.

The step of catalysis is accomplished by immersion of the nonconductor in the catalyst solution for a period of time ranging between 1 and 10 minutes. Catalyst temperature can vary from about room temperature to 150° F. Catalysis is required for this embodiment of the subject invention though the procedure used to catalyze the nonconductor is in accordance with prior art procedures.

Following adsorption of the catalyst on the substrate, the substrate having the adsorbed catalyst is desirably contacted with a conventional accelerator solution such as a mild hydrochloric acid solution. Acceleration is conventional in the art. Thereafter, the catalyst is converted to a non-metallic conductive conversion coating 3 by contact of the adsorbed catalyst layer with a solution of a chalcogenide, preferably a sulfide solution. The treatment solution is one comprising the chalcogen preferably dissolved in a suitable solvent. For metal plating operations, aqueous solutions are preferred and in accordance with a preferred embodiment of the invention, an aqueous alkaline solution of a water soluble sulfide or thio compound is used. Most preferred are alkaline metal sulfide salts such as sodium, potassium and lithium sulfides and thio compounds such as sodium thiosulfate. Typically, such solutions contain from about 0.1 to 15.0 grams per liter of the chalcogenide. Treatment temperature is not critical and room temperature treatment is adequate. Immersion times of several minutes are satisfactory. Details for the step of formation of the conversion coating can be found in the above referenced U.S. Pat. No. 5,017,742.

In accordance with an alternative though lesser preferred embodiment of the invention, the non-metallic conductive coating may be formed using the process of the above-cited PCT published application 89/00204. In this embodiment, following treatment of the substrate with the oxidative agent such as potassium permanganate in accordance with said published application, the substrate is immersed in a solution containing from 1 to 50% of pyrol, furane, thiophene, pyrol derivatives or mixtures thereof. This additive is added to a suitable solvent in amounts of from 5 to 35% by weight. The substrate is then immersed in the monomer solution for a time ranging from about several seconds to 20 minutes. Room temperature treatment is satisfactory. Following treatment with the monomer solution, the substrate is activated by contact with an oxidizing solution such as a solution of an alkali metal persulfate, alkali metal peroxydisulfate, hydrogen peroxide, an iron salt such as ferric chloride, alkali metal periodates or similar compounds in acidic media. A solution containing an active oxidizing agent in an amount of from 25 to 75 grams per liter of solution is satisfactory. Treatment can be at room temperature with immersion from times of from 1 to 10 minutes and treatment is complete when a film of dark brown or black coloration is formed on the surface of the substrate. More details of the process can be found in the aforesaid PCT 89/00204 published application.

In accordance with a further embodiment of the invention, the non-metallic conductive film can be formed by a process as described in the above-referenced U.S. Pat. No. 4,897,164. It should be noted that the process of U.S. Pat. No. 4,897,164 contemplates only the plating of through-holes using copper clad substrates. However, in accordance with this invention, an entire unclad substrate may be plated electrically using the process of this patent.

In accordance with the process of the patent, a circuit board substrate material is provided having through-holes. The substrate is contacted with a composition consisting of carbon black particles having an average particle size of less than about 3 microns dispersed in a liquid dispersing medium where the amount of carbon black is sufficient to coat substantially all of said non-conducting surface but is less than about 4% by weight of the liquid dispersion. A surfactant is used to assist in the dispersing of the carbon black particles. Following contact of the substrate with the carbon black dispersion, a film is formed by drying resulting in a substantially continuous layer of carbon black over the substrate. The coated substrate is then contacted with an aqueous solution of a reducing agent, preferably an alkaline metal borate and the substrate is then ready for further processing as described below.

Following formation of the non-metallic conductive coating, the printed circuit board may be fabricated using either a preferred fully additive process or a lesser preferred semi-additive process. A description of the fully additive method follows.

With reference to FIG. 3 of the drawings, following formation of the non-metallic, conductive conversion coating 3, a photoresist layer is applied to the substrate, exposed to activating radiation in an image pattern of a desired circuit and developed to yield image masking layer 4 with the non-metallic conductive conversion coating 3 bared within recesses defined by the imaged photoresist layer 4. As illustrated, the recesses define openings for both conductor lines and hole-walls and pads.

Photoresists are known in the art and are not considered to be a part of the invention. The selection of a suitable photoresist for practice of the process of this invention is dependent primarily on the required photolithographic properties of the photoresist and its ability to withstand harsh chemical environments during contact with the chemicals used to form the printed circuit boards. Acid resistance is an important property when plating with acidic copper electroplating solutions. A suitable resist is an acrylic resist available from Shipley Company Inc. under the trade designation NT-90 or a dry film photoresist such as the Riston ® photoresist dry films available from DuPont de Nemours Co. Developers for such photoresists are typically available from the company from which the photoresist is available.

At this stage in the process, the substrate is suitably prepared for metallization. The step of metallization is illustrated in FIG. 4 of the drawings. The substrate is immersed in a suitable electroplating solution and current is passed through the solution for a time sufficient to form a metal deposit of adequate thickness. In FIG. 4 of the drawings, metal plating has continued to form a conductive deposit 5 having a thickness corresponding to the thickness of the imaged photoresist layer and consequently, the recesses within the photoresist layer have been completely filled. This is desirable but not required as thinner coatings are also suitable.

It should be observed that for electroplating to occur, a continuous conductive surface over the entire substrate between electrodes is necessary for plating. In the process of the subject invention, conductive conversion coating 3 coats the entire substrate and is adequately conductive to enable electroplating to proceed.

The electroplating procedure utilized is conventional. The part to be plated uses a cathode in a conventional electroplating cell. Current density is conventional and varies typically within the range of from 15 to 45 amps per $ft^2$. Theoretically, a low initial current density should be preferred with current density increased as an initial deposit is formed. This would be expected to prevent burn-off of the conductive conversion coating, especially where the conductive conversion coating is substantially less conductive than a thin metal coating. However, in practice, severe adverse results caused by a high initial current density have not been observed. A preferred current density ranges from 15 to 30 amps per $ft^2$. The plating solution is maintained at a temperature ranging between room temperature and about 100° F. Plating is continued for a time sufficient to form a deposit of the desired thickness. For circuit board manufacture, a desired thickness may range between 0.5 and 2 mils, typically from 1 to 1.5 mils. A plating time of from 15 to 90 minutes is typically required to obtain a deposit of the preferred thickness within the preferred range of current densities, but this time may vary based upon the proprietary plating solution used. The conductors 5 formed by the process are uniform in thickness, free of defects and well bonded to the surface over the nonconductor over which it is plated. Bond strength is typically satisfactory to withstand solder shock testing as conventionally used in printed circuit board manufacture.

FIG. 5 of the drawings illustrates the next step in the process. The resist coating 4 and the underlying non-metallic conductive conversion coating 3 bared by removal of the coating 4 are removed. The resist coating is dissolved from the substrate using an organic solvent. Such materials are available from the source of the photoresist and are known in the art as Removers. The underlying non-metallic conductive conversion coating 3 is removed by contact with a reagent capable of dissolving this layer. If the layer is a metal chalcogenide, it is removed by contact with a solution of a suitable oxidizing agent such as nitric acid, cupric chloride, ferric chloride, sulfuric acid—hydrogen peroxide mixtures and potassium permanganate. If the conversion coating 3 is a polymerized conductive coating, it may be removed with an organic solvent.

Removal of conversion coating 3 beneath photoresist coating 4 is desirable. Since this coating is moderately conductive, permitting it to remain on the substrate could result in failure of the circuit in use due to shorting of circuit lines through the conversion coating lying between the lines.

The final major step in the fully additive embodiment of the invention is illustrated in FIG. 6 of the drawings. This step is optional but desired. Openings between circuit lines formed as a consequence of removal of the photoresist are filled by application of a permanent dielectric material 6 such as the soldermask material disclosed in European Published Application, Publication No. 0 502 382. The use of the dielectric provides dimensional stability to the circuit pattern. Suitable dielectrics are those conventionally used in the manufacture of printed circuit boards and include polyamides and polyimides. The method of applying the permanent dielectric is any of the methods known in the art, including screening, curtain coating, slot coating, etc.

The lesser preferred, semi-additive embodiment of the invention is illustrated in FIGS. 1 and 2 and 7 through 10. This procedure uses the same substrate and non-metallic conductive conversion coating as in the fully additive process. The substrate is prepared as shown in FIGS. 1 and 2 with substrate 1 having openings 2 for metallized through-holes coated on all surfaces with non-metallic conductive conversion coating 3.

The modification to the process for semi-additive manufacture is illustrated in FIG. 7 of the drawings where the entire substrate is metal plated with a flash coat of electrodeposited metal 7. A flash coat is a thin coat typically of a thickness of 10 to 50 millionths of an inch. This compares to 1 ounce copper cladding over a substrate where the cladding has a thickness of 1.4 mils.

The next step in the process is illustrated in FIG. 8 which is analogous to FIG. 3 with like parts having like numerals. Photoresist is applied over the metallized surface of the substrate, exposed to an image pattern of a desired circuit and developed to yield a resist relief image 4. In FIG. 9, the relief image 4 has been electroplated to provide copper conductors 5 in a manner analogous to the procedures used for the procedure illustrated in FIG. 4.

The next step in the process is depicted in FIG. 10 and is analogous to the process steps described with respect to FIG. 5. Again, the photoresist coating 4 is removed to bare the underlying flash coating of metal 7 which is coated over non-metallic conductive conversion coating 3. The copper is removed by chemical etching such as with ammoniacal etchants, cupric chloride etchants, ferric chloride etchants and sulfuric acid-hydrogen peroxide etchants. Thereafter, the underlying conductive conversion coating 3 is removed as described above.

The step of removal of the flash coating of metal in the above-described semi-additive process is mandatory because of the conductivity of the copper and shorting of the board in use as a consequence of failure to remove this layer. The step of plating the flash coat and the step of chemical etching to remove the flash coat are additional steps not required in the fully additive process described above. Moreover, chemical etching of metal is an environmentally undesirable procedure. For these reasons, the semi-additive process is lesser preferred. However, in certain instances, the semi-additive process may be commercially desirable due to decreased plating time as a consequence of the higher conductivity of the metal flashed plate compared to the conductivity of the conductive conversion coating.

Following removal of the flash plate and underlying conversion coating, recesses may be filled with a permanent dielectric material (not illustrated in the drawings) in a manner analogous to the procedure described with respect to FIG. 6.

The invention will be more fully illustrated by the examples that follow.

EXAMPLE 1

This example illustrates a fully additive method that may be used for formation of a printed circuit board. A circuit board substrate provided with through-holes was subjected to the following procedure:

Step 1—Preclean and condition
(a) desmear the hole-walls with an alkaline permanganate etchant maintained at a temperature of 70° F. for 20 seconds and water rinse;
(b) remove glass fibers extending into the holes by etching with an ammonium bifluoride solution (1 lb/gal.) maintained at 70° F. for 4 minutes and water rinse;
(c) condition all surfaces including hole-walls using an alkaline amine solution identified as Conditioner 231 at 10% strength at a temperature of 140° F. for 5 minutes and water rinse.

Step 2—Catalyze
(a) immerse the substrate in an acidic sodium chloride based solution identified as Cataprep ® 404 at room temperature for 1 minute and water rinse; and
(b) immerse the substrate in an acidic solution of a palladium tin colloid identified as Cataposit ® 44 catalyst at 6% strength at a temperature of 115° F. for 5 minutes and water rinse.

Step 3—Accelerate
Immerse the substrate in an acidic accelerating solution identified as Accelerator 19 at a temperature of 70° F. for 1 minute and water rinse.

Step 4—Form conversion coating
Immerse the substrate in a room temperature solution of sodium thiocarbonate for two minutes and water rinse where the solution had a concentration of 10 grams/liter of sodium thiocarbonate per liter and a pH of about 12 adjusted with sodium hydroxide.

Step 5—Apply and image photoresist
(a) dry the boards having the conductive conversion coating;
(b) apply a dry film of Riston ® 3015 photoresist available from E. I. DuPont de Nemours and Co. of Wilmington, Del. at an application temperature of about 100° C. and wait 15 minutes following application of the film; and
(c) expose the film to a source of activating energy to obtain the desired circuit pattern at an exposure energy of 40 mJ/cm.

Step 6—Develop imaged photoresist
Place the imaged board in a spray developer chamber using a solution consisting of 5 lbs. of sodium carbonate and 1 gal. of butyl carbonate per 60 gals. and develop at a temperature of 80° F. for one minute.

Step 7—Electroplate
Electroplate copper from an acid copper electroplating bath identified as Electroposit ® 892 acid copper at a current density of 30 amps/sq. ft. and at a temperature of 70° F. for 30 minutes and water rinse.

Step 8—Remove photoresist
Spray the board with a 2% potassium hydroxide solution at a temperature of 85° F. for one minute.

Step 9—Remove conversion coating
Immerse the board in a peroxide sulfuric etchant identified as Pre-Etch 746 at a temperature of 110° F. for 1 minute and water rinse.

Step 10—Apply a permanent soldermask such as by curtain coating

EXAMPLE 2

The following example sets forth a method for the formation of a printed circuit board that may be used illustrating the semi-additive mode of the invention.

Repeat steps 1 through 4 of Example b 1.
Step 5—Electroplate
Electroplate copper from an acid copper electroplating bath identified as Electroposit ® 892 acid copper at a current density of 30 amps/sq. ft. and at a temperature of 70° F. for 2 minutes to form a flash plate of copper and water rinse.

Step 6—Apply and image photoresist
(a) dry the boards having the flash copper coating;
(b) apply a dry film of Riston ® 3015 photoresist available from E. I. DuPont de Nemours and Co. of Wilmington, Del. at an application temperature of about 100° C. and wait 15 minutes following application of the film; and
(c) expose the film to a source of activating energy to obtain the desired circuit pattern at an exposure energy of 40 mJ/cm.

Step 7—Develop imaged photoresist
Place the imaged board in a spray developer chamber using a solution consisting of 5 lbs. of sodium carbonate and 1 gal. of butyl carbonate per 60 gals. and develop at a temperature of 80° F. for one minute.

Step 8—Electroplate
Electroplate copper from an acid copper electroplating bath identified as Electroposit ® 892 acid copper at a current density of 30 amps/sq. ft. and at a temperature of 70° F. for 30 minutes and water rinse.

Step 9—Remove photoresist
Spray the board with a 2% potassium hydroxide solution at a temperature of 85° F. for one minute.

Step 10—Remove the flash coating of copper and underlying conversion coating
Immerse the board in a peroxide sulfuric etchant identified as Pre-Etch 746 at a temperature of 110° F. for 1 minute and water rinse.

Step 11—Apply a permanent soldermask such as by curtain coating

I claim:

1. A printed circuit board comprising a nonconductive substrate coated with electroplated metal in a discrete pattern of circuit lines and through-holes, said electroplated metal having a thin film of non-metallic conductive coating having a surface resistivity not exceeding 100 megaohms between it and said substrate but not elsewhere on said substrate.

2. The article of claim 1 where the printed circuit is on both sides of said substrate and joined through conductive through holes.

3. The article of claim 1 where the electroplated metal is electroplated copper.

4. The article of claim 1 where the surface resistivity of the non-metallic coating varies between 10 kiloohms and 10 megaohms.

5. The article of claim 1 where the non-metallic conductive coating is an organic polymer.

6. The article of claim 1 where the non-metallic conductive coating is carbon black.

7. The article of claim 1 where the non-metallic conductive coating is an inorganic metal chalcogenide.

8. The article of claim 7 where the chalcogenide is a sulfide.

9. The article of claim 7 where the chalcogenide is a noble metal sulfide.

10. The article of claim 7 where the chalcogenide is palladium sulfide.

11. The article of claim 1 where the metal in a discrete pattern is confined within imaged recesses over said substrate.

12. The article of claim 11 where the imaged recesses are of a photoresist.

13. The article of claim 1 where the metal coated holes and circuit lines have a thin film of palladium sulfide between said electroplated metal and said substrate.

* * * * *